United States Patent
Boudry

(10) Patent No.: US 6,642,862 B2
(45) Date of Patent: Nov. 4, 2003

(54) METHOD FOR ENCODING/DECODING DIGITAL DATA TRANSMITTED THROUGH A SERIAL LINK, PARTICULARLY OF THE 8B/10 TYPE, AND DEVICE FOR IMPLEMENTING SAME

(75) Inventor: Jean-Marie Boudry, Beynes (FR)

(73) Assignee: Bull S.A., Les Clayes-sous-Bois (FR)

( * ) Notice: Subject to any disclaimer, the term of this patent is extended or adjusted under 35 U.S.C. 154(b) by 0 days.

(21) Appl. No.: 10/002,139

(22) Filed: Dec. 5, 2001

(65) Prior Publication Data

US 2002/0109616 A1 Aug. 15, 2002

(30) Foreign Application Priority Data

Dec. 5, 2000 (FR) .............................. 00 15724

(51) Int. Cl.[7] .............................. H03M 5/00
(52) U.S. Cl. .............................. 341/58; 341/59; 341/95; 709/231; 370/535
(58) Field of Search .............................. 341/58, 59, 95; 709/231; 370/535

(56) References Cited

U.S. PATENT DOCUMENTS

| | | | |
|---|---|---|---|
| 4,486,739 A | * 12/1984 | Franaszek et al. | ............ 341/59 |
| 5,025,256 A | 6/1991 | Stevens | |
| 5,229,769 A | * 7/1993 | Gleichert | ............ 341/58 |
| 5,699,062 A | * 12/1997 | Widmer | ............ 341/58 |
| 5,748,119 A | 5/1998 | Ko | |
| 5,974,464 A | * 10/1999 | Shin et al. | ............ 341/58 |
| 6,111,528 A | * 8/2000 | Bagley | ............ 341/58 |
| 6,295,010 B1 | * 9/2001 | Thiesfeld | ............ 341/58 |
| 6,333,704 B1 | * 12/2001 | Jung et al. | ............ 341/58 |
| 6,346,895 B1 | * 2/2002 | Lee et al. | ............ 341/58 |
| 6,501,396 B1 | * 12/2002 | Kryzak et al. | ............ 341/58 |

FOREIGN PATENT DOCUMENTS

| | | |
|---|---|---|
| EP | 0 751 522 A | 1/1997 |
| WO | WO 98 34413 A | 8/1998 |

* cited by examiner

*Primary Examiner*—Michael Tokar
*Assistant Examiner*—Lam T. Mai
(74) *Attorney, Agent, or Firm*—Edward J. Kondracki; James T. Carmichael; Miles & Stockbridge P.C.

(57) ABSTRACT

A method and a device is disclosed for encoding/decoding digital data transmitted through a serial link, particularly of the so-called "8B/10B" type. A full encoded binary word includes 8 data bits and a 2-bit label. The logical state of a center bit triplet of the byte is detected. When all of the bits are in the same logical state, the center bit of the triplet is inverted prior to transmission. Otherwise, the byte is transmitted as is. The label is forced to the logical configuration "10" when there is a bit inversion, and to "01" in the opposite case. Upon decoding, this configuration is tested and the center bit received is selectively inverted as a function of the result of the test. In a preferred variant, the method also includes tests of the label and the triplet after decoding, when there has been a bit inversion in the encoding. The device comprises logical circuits based on inverters and "AND," "OR" and "EXCLUSIVE-OR" logic gates.

12 Claims, 3 Drawing Sheets

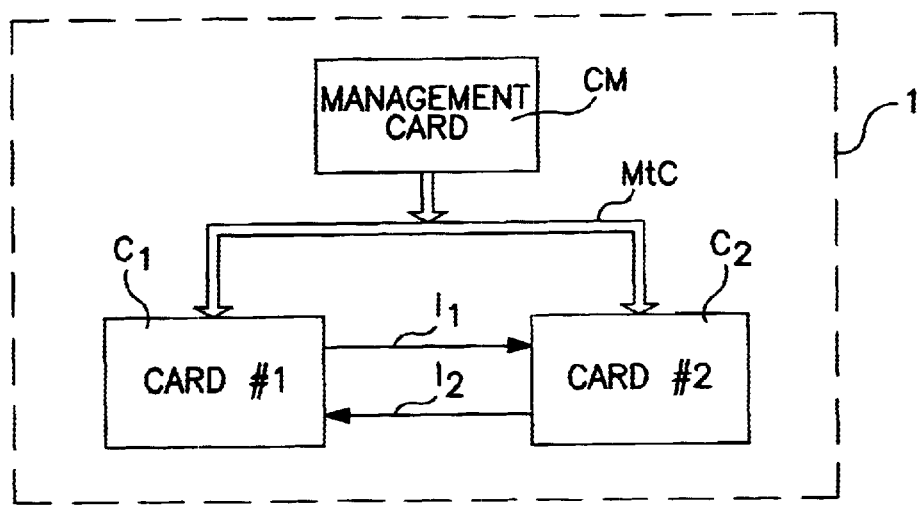
FIG. 1
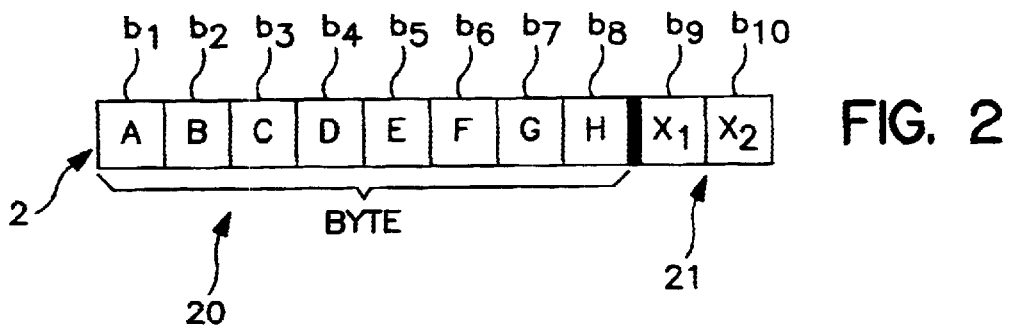
FIG. 2
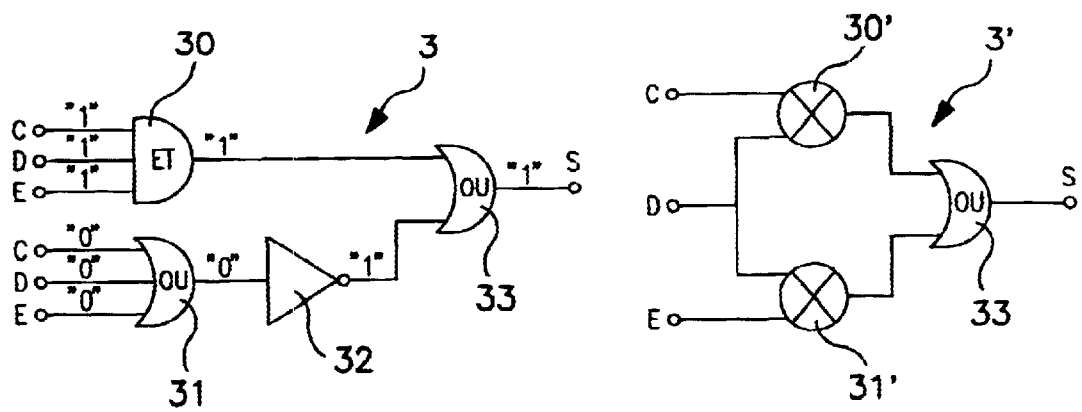
FIG. 3A
FIG. 3B

METHOD FOR ENCODING/DECODING DIGITAL DATA TRANSMITTED THROUGH A SERIAL LINK, PARTICULARLY OF THE 8B/10 TYPE, AND DEVICE FOR IMPLEMENTING SAME

CROSS REFERENCE TO RELATED APPLICATION

The subject matter of the subject invention is related to application Ser. No. 10/088,224 filed on Mar. 19, 2002, (corresponding to PCT/FR 01/00148), in the names of: Denis PINSON ET AL. entitled "LINK BETWEEN A CENTRAL SYSTEM AND A SATELLITE SYSTEM FOR EXECUTING OPERATIONS OF THE CENTRAL SWITCH, the subject matter of which is incorporated herein in its entirety.

BACKGROUND OF THE INVENTION

1. Field of the Invention

The invention concerns a method for encoding/decoding digital data transmitted via serial links.

It particularly concerns an encoding/decoding method of the so-called 8B/10B type, the letter "B" being the abbreviation for "bit."

It applies more particularly to serial links of the high speed short distance type.

The invention also concerns a device for implementing the method.

Within the context of the invention, the term "digital data" should be understood in its most general sense. It includes the concepts of messages, binary words, etc., and generally all sequences of binary elements or bits, the length of which is determined by the particular application envisaged.

2. Description of the Related Art

Transmissions of the aforementioned byte are specifically characterized by the fact that they are not associated with a clock, unlike, for example, parallel transmissions of digital data. In the latter case, all the bits that compose a binary word, for example, are transmitted simultaneously, through as many physical links. It follows that in the case of a serial link, it is necessary to adopt measures for retrieving clock information in the receiver.

Another constraint that must generally be obeyed is the need to guarantee a pre-established transition rate among all the bits constituting a binary sequence. Typically, it is desirable to obtain an average rate of 30% for a 1000-bit sequence.

Yet another constraint relates to the setting of a particular parameter known as "Maximum Run Length"("MRL"), or the maximum number of successive bits that can remain at the same logical value, "0" or "1."

In the prior art, in order to meet satisfy these requirements simultaneously, so-called "DC balanced" codes are most often used, i.e. codes that do not induce any DC component, at least within a pre-established time interval.

One of the characteristics of these codes is that they incorporate control and/or command words that specifically make it possible to retrieve clock signals on the receiving end of the binary sequences sent, but also control the sending and receiving procedures of the devices located at both ends of the chain (transmitter and receiver).

However, while this type of code makes it possible to solve, at least partially, the problems mentioned above, this technique is not without its drawbacks.

In particular, these codes involve the use of highly complex circuits. In practice, they are essentially used for "long distance" links.

One need that has arisen in recent information technologies is tied to the increase, in a single device or even in a single electronic circuit card, in the number of asynchronous serial links. For example, in a single device, there are card-to-card links. In a single card, there are links between modules or integrated circuits ("chips"). To illustrate the concept, the number of links can reach several tens of units, for example typically 72 asynchronous serial links between two "chips."

SUMMARY OF THE INVENTION

In this context of the preferred application of the invention, the essential characteristic of the transmissions in question is that they take place over short distances—a few centimeters or even a few millimeters. Moreover, current technologies make it possible to use very high frequencies, commonly higher than 2.5 Mbps.

It is understood that, under these conditions, the solutions of the prior art, particularly the use of so-called "DC balanced" codes involving a high degree of complexity in terms of electronic circuits, cannot be satisfactory, especially since the proximity of the circuits and/or modules does not entail incorporating command words into the binary sequences transmitted.

FIG. 1, attached to the present specification, schematically illustrates an exemplary architecture of asynchronous serial links, 11 and 12, between two electronic circuit cards, $C_1$ and $C_2$ respectively, located in proximity to one another in a single unit 1. A third electronic circuit card, which will be called a "management card" CM transmits control words MtC, for example via a single bus, to the two electronic circuit cards $C_1$ and $C_2$, which are in close connection.

While it is not mandatory, for short distance links, to incorporate command words into the binary sequences transmitted, it is nonetheless necessary, no matter what encoding method is used, to meet all of the other requirements mentioned.

It is also important for the encoding process not to propagate the errors if one or more bits are set erroneously (inversion of their logical states). This requirement is particularly important when implementing means for detecting and correcting errors (codes known as "ERC" or "Error Recovery Codes"). Upon reception, the message decoded and processed by the "ERC" circuits should be identical to the original message sent, even if errors occur during transmission.

The object of the invention is to eliminate the drawbacks of the devices and systems of the prior art, some of which have been summarized, while meeting the needs that continue to arise.

In particular, the method according to the invention makes it possible to greatly simplify the encoding circuits required for its implementation, without deteriorating the quality of the transmissions.

More particularly, but not exclusively, the preferred applications of the invention concern an encoding of the so-called 8B/10B type. As indicated, the letter "B" stands for "bits." This type of code is particularly advantageous because it makes it possible to handle bytes comprising exactly 8 bits, which will be qualified as data bits, since they convey information. The byte is completed by 2 additional bits, in specific logical states "1" or "0." Such codes are intrinsically known. An example may be found in U.S. Pat. No. 5,025, 256 A (International Computers Limited).

The main subject of the invention is a method for encoding/decoding digital data to be transmitted through a serial link, said digital data comprising a first so-called data bit sequence and a second so-called "label" bit sequence, characterized in that, said first and second sequences having first and second given bit lengths, it includes at least one encoding phase comprising at least a step for checking at least one slice of at least two consecutive bits, each of said slices being located in a predetermined area of said first bit sequence, so as to create a partitioning of the latter into parts of approximately equal length, said check consisting of performing a test to determine whether the consecutive bits of each of said slices are in the same logical state, "0" or "1," a second step consisting of setting the bits of said second sequence to predetermined logical state configurations in one-to-one relation with the result of said test, and a step for inverting at least one bit of said slices when the result of said test is positive and for transmitting said first bit sequence without any modifications when the result of said test is negative.

Another subject of the invention is a device for implementing this method.

BRIEF DESCRIPTION OF THE DRAWINGS

The invention will now be described in greater detail by referring to the attached drawings, in which:

FIG. 1 schematically illustrates an architecture of asynchronous serial links between two electronic circuit cards;

FIG. 2 illustrates a binary word encoded according to the 8B/10B method;

FIGS. 3A and 3B illustrate exemplary circuits for detecting a particular configuration of the word of FIG. 2, usable in an encoder for implementing the method according to the invention;

Figure 4:
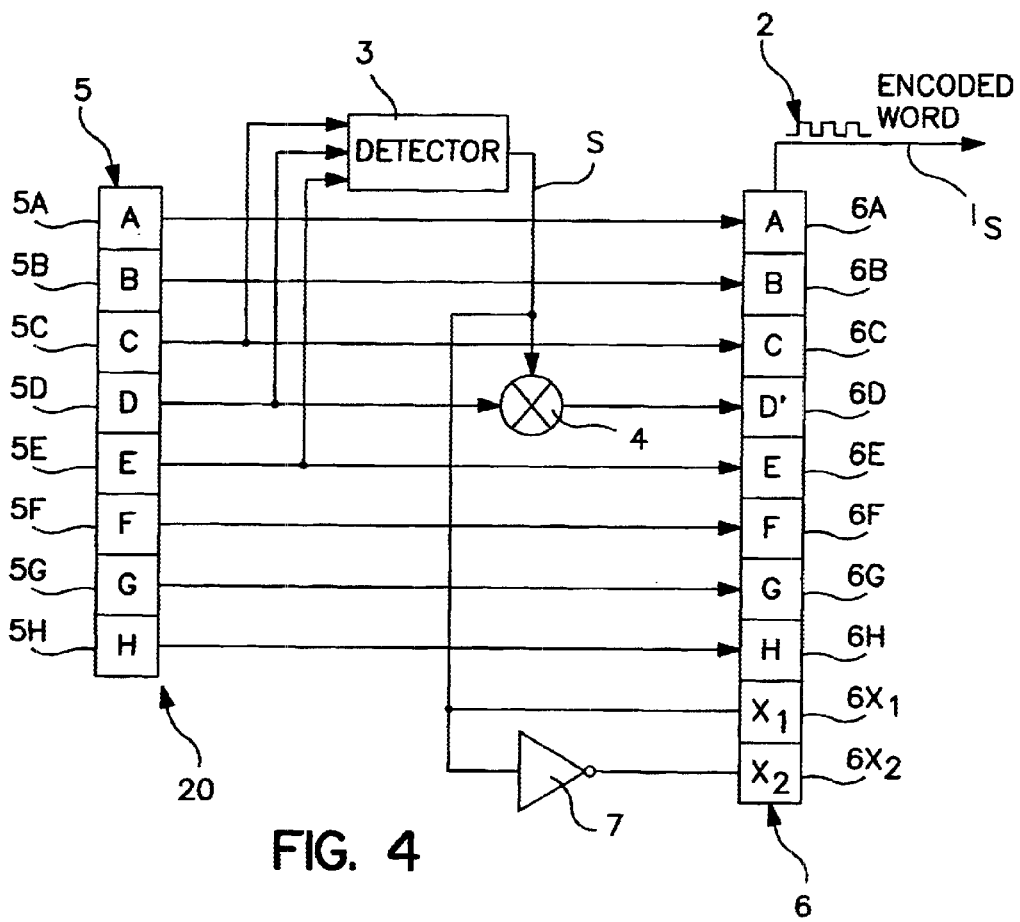
FIG. 4 illustrates an exemplary embodiment of a complete encoder according to the invention incorporating one of the circuits of FIG. 3A or 3B.

We will now describe in greater detail a preferred exemplary embodiment of the method for encoding digital data transmitted through an asynchronous serial link according to the invention. First of all, to illustrate the concept without in any way limiting the scope of the invention, we will consider the context of the preferred application of the invention, i.e. an encoding of the 8B/10B type.

DESCRIPTION OF THE PREFERRED EMBODIMENTS

FIG. 2 illustrates a binary word with 10 bits, labeled $b_1$ through $b_{10}$. The positions of bits 20, $b_1$ through $b_8$, which are referenced "A" through "H," constitute the data bits per se (byte). The positions A through H can each assume the logical states 1 or 0.

The two additional bits 21, $b_9$ and $b_1$, are referenced "$X_1$" and "$X_2$" in FIG. 2. These bits can be called "label" or "pattern" bits. In a preferred embodiment, these bits are simply concatenated with the eight other bits of the byte 2. The logical state, 1 or 0, of the two bits $b_9$ and $b_{10}$ depend on the logical values of at least some of the other bits $b_1$ through $b_8$ of the word 2, and obey rules, which will be specified.

In general, the eight bits $b_1$ through $b_8$ of the byte 20 are transmitted as is, and the label bits 21 then assume the logical state "01" ($b_9b_{10}$). The label 21 can be concatenated either in front of or behind the bits of the byte 20, the bit $b_1$ ("A") being assumed to the first bit of the byte 20 to be sent.

The full binary word 2 therefore has the logical configuration "ABCDEFGH01".

On the other hand, in the case where three consecutive bits of the central area of the byte 20 are in the same logical state (0 or 1, respectively), the center bit of this area is inverted in order to increase the transition density. Either the bit triplet $b_3b_4b_5$ (positions "CDE") or the bit triplet $b_4b_5b_6$ (positions "DEF") are chosen. The center bit is therefore the bit $b_4$ (position "D") in the first case or the bit $b_5$ (position "E") in the second case. The choice of the three bits is made a priori once and for all for a given embodiment.

In this case, the label 21 has been given to the logical configuration "10" ($b_9b_{10}$).

For example, if the byte 20 has the logical value "11111000," the full word is encoded as follows: "11101000-10," it being understood that the dash is simply used to indicate the separation between the byte 20 and the label 21, but it does not physically exist, the two bit strings being sent one after the other, without any time interval separating them a priori. It is noted that the bit $b_4$ (position "D") is inverted relative to its original logical value.

Using the encoding method according to the invention, the following characteristics are obtained:

minimum transition frequency: 2 for 10 bits, or 20%;
  maximum number of consecutive identical bits or "max run length": 6, when the non-transition detection involves 3 consecutive bits of a center area (see FIGS. 3A and 3B below) and 5, when this same detection involves only 2 bits (see FIG. 7 below); and
  non-propagation of the errors and retention of the "ERC" codes transmitted.

In essence, when it comes to this last characteristic, if the data (byte 20) contains one or more error(s), this error or errors is (are) simply transmitted. By contrast, in the case of a transcoding according to the prior art, there is a real risk of propagation of the errors.

Furthermore, the device required to obtain the encoding is very simple to produce.

FIG. 3A illustrates a first exemplary basic embodiment of an "AND" logic gate 30 and two "OR" logic gates 31 and 33, and an inverter 32.

In FIG. 3A, it is assumed that the three center bit positions ("CDE") have been retained. The "AND" 30 and "OR" 31 logic gates have three inputs, each receiving one of the three signals of the triplet "CDE." The output of the "OR" logic gate 31 is connected to the input of the inverter 32. The output of the inverter 32 is connected to a first input of the "OR" logic gate 33. A second input directly receives the output from the "AND" logic gate 30. As illustrated in FIG. 3A, the "AND" logic gate 30 detects the simultaneous appearance of bits in the logical state "1" (output from this gate in the logical "1" state) and the "OR" logic gate 31 detects the simultaneous appearance of bits in the logical state "0" (output from this gate in the logical "0" state). In both of these cases, the "OR" logic gate 33 receives a logical "1" in either of its inputs. The output S of this gate in this case becomes a logical "1," which indicates that the three center bits $b_3b_4b_5$ (positions "CDE" in the example) are in the same logical state (either "111" or "000"). The application of well known rules of combinational logic shows that, in all other cases, the output S is in the "0" logic, which indicates that these three center bits are not in the same logical state and that the byte 20 can be transmitted as is.

FIG. 3B illustrates another exemplary embodiment of a logical circuit 3' that fulfills the same function as the circuit 3 of FIG. 3A, i.e., the testing of the bits of the triplet in the same logical state. The circuit is constituted by two "EXCLUSIVE-OR" logic gates with two inputs 30' and 31', the first of which receives in its inputs the bits in the positions "C" and "D" (or "D" and "E" if the triplet "DEF" has been chosen"), the second of which receives in its inputs the bits in the positions "D" and "E" (or "E" and "F" if the triplet "DEF" has been chosen). The outputs of the "EXCLUSIVE-OR" gates 30' and 31' are transmitted to the two inputs of an "OR" logic gate 33, which plays a role similar to the gate with the same reference in FIG. 3A, whose output is referenced S. However, in the case of the circuit of FIG. 3A, the output S delivers a signal in the logical state "0" for a configuration in which all the bits of the input triplet are in the same logical state (either "111" or "000"). If the output signal of this inverter must have the logical state "1" for this same logical configuration, the "OR" gate 33 must be followed by an inverter (not represented).

The output signal S is used to drive the inversion of the bit $b_4$ (position "D") or $b_5$ (position "E"), if necessary.

We will now describe an exemplary complete encoding circuit according to the invention and its auxiliary circuits in reference to FIG. 4.

It is assumed that the byte 21 is initially stored in a register 5 or any other similar element ("JK" type toggles, RAM positions, etc.). The positions "A" through "H" are stored in eight cells of this register 5, or 5A through 5H. The outputs of the center cells 5C through 5E (for example) are transmitted to the inputs of the circuits 3 (FIG. 3A or 3', FIG. 3B), which can be called detector circuits. With the exception of the output of the cell 5D (position "D") the outputs of the other cells 5A through 5C and 5E through 5H are also transmitted to the corresponding inputs of the cells 6A through 6C and 6E through 6H of a second register 6. It follows that the positions A through C and E through H are simple copies of the corresponding positions of the register 5. On the other hand, the output from the cell 5D (position "D") is transmitted to the input of the cell 6D via a logic gate of the "EXCLUSIVE-OR" type 4. The latter therefore receives in a first input the output of the cell 5D and in a second input the output S of the detector circuits.

The storage position of the cell 6D in the register 6 is referenced D', since it is no longer a simple copy of the position D. If the output S is in the logical state "0", "D" and "D'" are identical (both in the logical "0," for example). That is the general case. On the other hand, if the circuits 3 detect three consecutive bits in the same logical state (see FIG. 3A), the output S changes to the logical "1" and the corresponding bit at "D" is inverted.

In the example illustrated in FIG. 4, the register 6 includes two additional cells $6X_1$ and $6X_2$, designed to store the label bits (positions referenced $X_1$ and $X_2$). These bits can be generated simply from the output S. The latter need only be directly connected to the input of the first additional cell $6X_1$, and via an inverter 7, to the input of the second additional cell $6X_2$.

In the general case, S is in the logical state "0." It follows that $X_1$ is in the logical state "0" and $X_2$ is in the logical state "1" because of the inverter 7. When S is in the logical state "1," the situation matches the preceding one, i.e. "10."

Once encoded, the full encoded binary word 2 (FIG. 2: byte 20 and label 21) is emitted and transmitted through a serial link $1_s$ to a receiving element (not represented). The circuits required for the proper transmission of the binary word 2 depend on the precise application envisaged and are intrinsically well known to one skilled in the art. It is unnecessary to describe them further.

On reception, the inverse process must be executed. If the label 21 has the logical configuration "01," it means that there has not been any encoding per se. The byte 20 can be accepted as is, without an inversion of the central bit $b_4$ (position "D"). On the other hand, if the configuration is "10," it means that the central bit must be inverted.

Figures 5, 6:
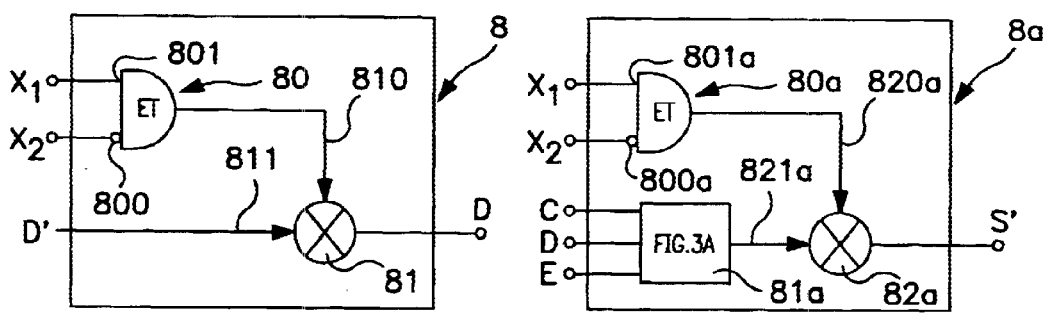
FIG. 5 illustrates an exemplary detection circuit usable in a decoder for implementing the method of the invention for a word encoded by the circuit of FIG. 4.
FIGS. 6 and 7 illustrate exemplary circuits for detecting errors in the encoded words received by the decoder.

The FIG. 5 schematically illustrates an exemplary embodiment of a logical circuit 8 that allows both the necessary detection and the selective inversion operation. This circuit 8 comprises an "AND" logic gate 80, one input of which 800 is inverting and the other of which 801 is direct, and that receive the label bits $X_2$ and $X_1$ respectively. The output of this "AND" logic gate 80 is transmitted to a first input 810 of an "EXCLUSIVE-OR" logic gate 81, which receives in a second input 811 the transmitted bit corresponding to the position "D'." By applying the rules of combinational logic, it is easy to see that the outgoing bit (position "D") of the logic circuit 8 is not modified if the configuration "$X_1X_2$" is "01" and is inverted if the configuration is "10."

The word available in the receiving element, in particular the "usable" part corresponding to the information byte 20, is then correctly reconstituted.

In a first additional variant of the method according to the invention, it is also possible to verify certain errors associated with the label 21. In essence, in the example described, it can only have the logical configurations "01" and "10." The configurations "00" and "11" are therefore not possible, and indicate that this label 21 contains an error. A simple logical circuit, similar to the one in FIG. 3A, for example, makes it possible to detect these two configurations. Instead of using "AND" logic gates with three inputs (FIG. 3A: 30 and 31), logic gates with two inputs are used. The latter receive the bits from the positions "$X_1$" and "$X_2$." With this exception, the configuration of the error detection circuit in the label 21 can be identical to that of the circuit of FIG. 3A. The output of the "OR" logic gate (FIG. 3A: 33) in the logical state "1" indicates an error. In essence, to obtain this result, it is necessary for the bits in the positions "$X_1$" and "$X_2$" to be in the same logical state, "1" or "0."

It may also be seen that a dual error in the label 21 translates into a single error in the data part (byte 20), hence into an error reduction and not a propagation.

In a second variant of embodiment, an additional check is advantageously performed on the data bits (byte 20). In essence, if the label configuration ("10") has caused the inversion of the center bit on reception (for example in the position "D"), three center bits (positions "CDE") must be in the same logical state "000" or "111." Either of these configurations can be detected very simply.

The logical circuit of FIG. 6 illustrates an exemplary circuit 8a that allows this detection. In practice, the circuit 8a can be constituted by the association of an "AND" logic gate 80a with a direct input 801a and an inverting input 800a that receive the bits from positions "$X_1$" and "$X_2$," and a logical circuit 81 identical to that of FIG. 3A (or 3B) for example. In essence, the latter should deliver through its output, as in the case of FIG. 3A (or 3B), a signal in the logical state "1" if, and only if, all of its inputs are in the same logical state "1" or "0." The logic gate 80a detects the logical configuration "10" of the bits from positions "$X_1X_2$" and delivers, in this case, a signal in the logical state "1." These two output signals are compared by means of an "EXCLUSIVE-OR" 82a, which receives them through its inputs 820a and 821a, and which delivers through its output S' a signal in the logical state "0" if, and only if, its two inputs are in the same logical state "1" or "0", and in the logical state "1" in all other cases, which indicates that there is an error. In essence, the two inputs in the logical state "1" indicate that the bits of the positions "CDE" are all in the same logical state ("1" or "0") and that there has been an inversion (configuration of "$X_1X_2$"="10"), and the two inputs in the logical state "0" indicate that the bits in the positions "CDE" are in different logical states and that there has not been an inversion (configuration of "$X_1X_2$"=("01"). These two cases indicate, a priori, that there are no errors.

It is noted that the logic gate 80a can be omitted. In fact, it is enough to also transmit the output from the logic gate 80 (FIG. 5) to the input 820a of the "EXCLUSIVE-OR" logic gate 82a, which constitutes an additional simplification.

In yet another variant of embodiment according to the invention, one simply verifies that there is no transition between two successive center bits, for example the bits $b_4$ and $b_5$ (positions "D" and "E"), referring again to FIG. 2. These two positions should be set in advance.

Figure 7:
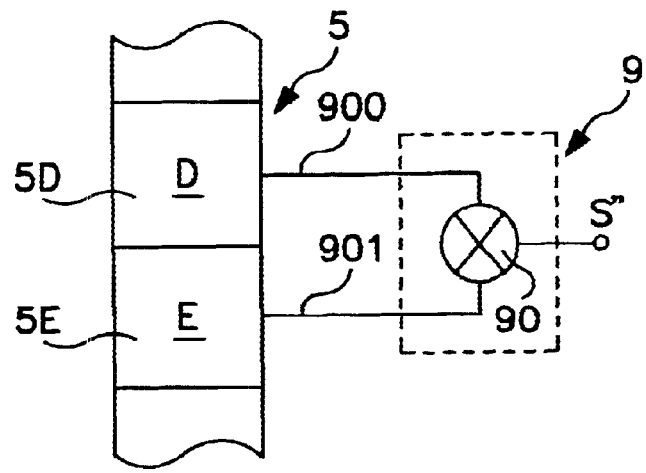

FIG. 7 illustrates an exemplary embodiment of a logical circuit 9 that makes it possible to obtain such a detection. This circuit is produced by means of a single "EXCLUSIVE-OR" logic gate 90 with two inputs 900 and 901. In the example described, the bits in the positions "D" and "E" are transmitted to these inputs. The state of the output S" of the circuit 9 makes it possible to detect the absence or the presence of transitions between the bits in the positions "D" and "E."

Up to this point in the description, it has been assumed that the "useful" segment of the word, i.e. the informational data, occupies one byte and that the context is that of the preferred application of the invention, i.e. so-called 8B/10B encoding.

However, as indicated, the method according to the invention is not limited to this application alone. The encoded word and the informational data part can naturally be of different lengths, particularly longer lengths.

Figure 8A:
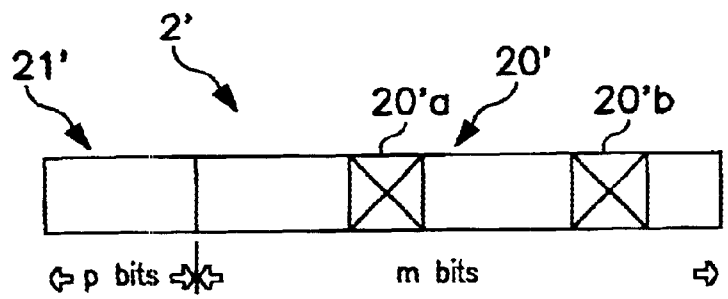
FIGS. 8A and 8B illustrate words encoded according to the invention, of any length.

FIG. 8A illustrates, in a general way, a word to be encoded 2' with a structure according to the invention. The informational date 20' occupies a sequence with an arbitrary length of m bits and the label 21' occupies a sequence with a length of p bits. In order to ensure, in particular, a "Maximum Run Length" ("MRL"), or predetermined maximum number of successive bits that can remain at the same logical value "0" or "1," it is necessary to monitor the configuration of one or more slice(s) of n consecutive bits in predetermined areas of the sequence 20'.

FIG. 8A represents two bit slices 20'a and 20'b. The length of each of the slices is at least two consecutive bits. The MRL parameter depends on the number of bits monitored and the distribution of the slices. It is advantageous to have them equally distributed in the m-bit sequence (informational data 20'), or at least approximately equally distributed.

This way, the slices partition the m-bit sequence (informational data 20') in an approximately even fashion. The slices 20'a and 20'b are therefore located (at least approximately) at one-third and two-thirds of the n-bit sequence, the latter being partitioned into three parts of approximately the same length.

Similarly, if there are three slices (example not represented), they will be located at approximately at one-quarter, one-half and three-quarters of the m-bit sequence, the latter being partitioned into four parts of approximately the same length.

Finally, if t is the number of slices monitored, the number of extra bits (label 21') is equal to p, with $p \geq t$.

By choosing p=t+1, it is possible to guarantee at least one transition in the label 21'. This configuration constitutes a particular case, which has just been described in detail for an encoding of the 8B/10B type. This systematic transition can serve as a reference point for the equal distribution of the partitioning of the slices.

By choosing p=t+2, it is possible to guarantee at least two transitions in the label 21'.

The number of transitions increases in correlation to the value of p. Such a solution is advantageously applied when the number of slices, and hence the value of p, is high.

Figure 8B:
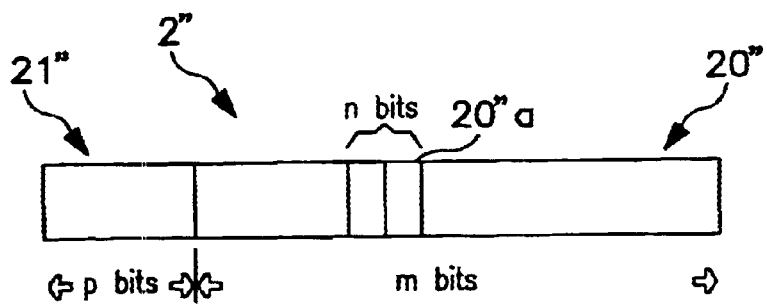

FIG. 8B illustrates the most general case. The word 2" comprises, as before, a data sequence 20" of m bits and a label 21" of p bits. The monitoring and detection circuits (for example FIG. 3A or FIG. 7) check the configuration of at least one slice 20"a with at least two consecutive bits, generally an n-bit slice.

Similar to what is described above, at least one given bit of a slice is inverted when all of the bits are detected to be in the same logical state "0" or "1." The slice configurations are forced into predetermined logical configurations as a function of this detection. The decoding is also performed in the way described in the case of "8B/10B" in the test of the configuration of the label. It follows that it is also possible to perform additional tests by detecting non-permitted logical configurations of the label. The latter, as a function of its bit length, can have a set of possible logical configurations. The authorized combinations form a first subset, and the unauthorized combinations form a second subset, the counterpart of the first. Finally, in the decoding, it is possible to test, when there has been a bit inversion, whether all of the bit slices are in the same logical state.

Through the reading of the above, it is easy to see that the invention achieves the stated objects.

The method according to the invention specifically makes it possible to guarantee:

a pre-established transition rate among all the bits constituting a binary sequence;

a "Maximum Run Length ("MRL") or maximum number or successive bits that can remain at the same logical value, "0" or "1"; and a non-propagation of errors in the transmitted data.

In addition, according to a very advantageous characteristic, these properties are obtained using only very simple logical circuits, making it possible to accommodate many serial links in the same device, or even in the same integrated circuit ("chip") card, without substantially increasing the production cost or the complexity.

It should be clear, however, that the invention is not limited to just the exemplary embodiments explicitly described, particularly in connection with FIGS. 3A through 8.

Nor is it limited, as indicated, to encoding of the "8B/10B" type alone.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the true spirit and full scope of the invention as set forth herein and defined in the claims.

What is claimed is:

1. A method for encoding/decoding digital data to be transmitted through a serial link, said digital data comprising a first data bit sequence and a second label bit sequence, said first and second sequences having first (m) and second (p) given bit lengths, said method comprising:

an encoding phase comprising checking at least one slice of at least two consecutive bits, each of said slices being located in a predetermined area of said first bit sequence, so as to create a partitioning of the latter into parts of approximately equal length, said checking step including performing a test to determine whether the consecutive bits of each of said slices are in a same logical state, setting the bits of said second sequence to predetermined logical state configurations in one-to-one relation with a result of said test, and inverting at least one bit of said slices when the result of said test is positive and transmitting said first bit sequence without any modifications when the result of said test is negative.

2. The method according to claim 1, wherein the number of bits (p) in said second sequence is greater than or equal to the number of said slices (t).

3. The method according to claim 1, wherein said encoding is of an "8B/10W" type, said first sequence having a length of 8 bits so as to form a data byte, wherein successive positions are numbered 1 through 8, wherein said second sequence has a length of 2 bits, and wherein said method further comprises checking a 3-bit slice that includes bit number 5, said bits of said second sequence being set to a logical configuration "10" when the result of said check indicates that said three bits of said slice are in the same logical state and in the logical configuration "01" in the opposite case.

4. The method according to claim 1, further comprising:

a decoding phase for decoding said encoded digital data comprising at least one step for checking the logical state configuration of the bits of said second sequence and a step for selectively inverting at least one bit of said slices upon detection, during said check, of predetermined logical configurations of said second sequence, in order to re-establish said first sequence in its original state.

5. The method according to claim 4, wherein said logical configurations that can be assumed by the bits of said second sequence are included in a first subset of all possible combinations permitted by the number of bits constituting this sequence, and wherein said method further includes detecting non-permitted logical state configurations, constituted by a second subset, the counterpart of the first, indicating at least one error occurring in said second sequence.

6. The method according to claim 4, wherein when said step for checking the logical state configuration of the bits of said second sequence indicates the presence of a bit inversion during the encoding, in at least one of said slices, an additional step after decoding is performed which includes verifying that all the bits of said slice are in the same logical state.

7. A device for encoding/decoding digital data to be transmitted through a serial link, said digital data comprising a first data bit sequence and a second label bit sequence, said first and second sequences having first (m) and second (p) given bit lengths, said device comprising:

an encoder having at least one first element for checking at least one slice of at least two consecutive bits, each of said slices located in a predetermined area of said first bit sequence, so as to create a partitioning of the latter into parts of approximately equal length, said first element performing a test to determine whether consecutive bits of each of said slices are in a same logical state, and delivering an output signal at an output in a first given logical state when said test is positive and in a second given logical state when said test is negative, a second element having a first and second input, said second element receiving the output signal from said first element through the first input and a given bit of said slices through the second input, so as to transmit it unchanged when said test is negative and to invert it when said test is positive, and a third element driven by said output signal for generating predetermined logical configurations, in one-to-one relation.

8. The device according to claim 7, wherein said encoding is an "8B/10B" type, wherein said first sequence has a length of 8 bits so as to form a data byte (A . . . H), wherein successive positions are numbered 1 through 8, said second sequence having a length of 2 bits, wherein said slice has a length of 3 bits, wherein said first element comprises an "AND" logic gate and an "OR" logic gate in parallel, each with three inputs, in order to receive through each of their inputs one of the 3 bits of said slice that includes bit number 5, and an "OR" logic gate with two inputs, receiving the output signal directly from said "AND" logic gate and receiving via an inverter the output signal from said "OR" logic gate, in order to deliver as output a signal in the logical state "1" if, and only if, all the bits of said slice are in the same logical state, wherein said second element is an "EXCLUSIVE-OR" logic gate with two inputs, receiving through a first input the output signal from said first element, and through a second input the center bit of said 3-bit slice, so as to transmit it unchanged when said test is negative and to invert it when said test is positive, and wherein said third element comprises an inverter receiving as input said output signal from said first element, said second sequence being constituted by a first bit in the same logical state as this signal and a second bit in the same logical state as the output signal from said inverter.

9. The device according to claim 7, further comprising:

a decoder comprising at least one checking element for checking the configuration of the bits of said second sequence in order to selectively invert at least one bit of said slices upon detection of given configurations indicating that this bit has been inverted during the encoding and to re-establish said first sequence in its original state.

10. The device according to claim 9, wherein the encoder is an "8B/10B" type, wherein said first sequence has a length of 8 bits so as to form a data byte, wherein successive positions are numbered 1 through 8, said second sequence having a length of 2 bits, wherein said slice has a length of 3 bits, said checking element comprising an "AND" logic gate having a direct input and an inverting input, the bits of said second sequence being transmitted to these respective inputs, and wherein an "EXCLUSIVE-OR" logic gate with two inputs receives through a first input the output signal from said "AND" logic gate, and through a second input the center bit (D') of said three-bit slice, in order to transmit it unchanged when the logical configuration of said second sequence is "01" and to invert it when the logical configuration of said second sequence is "10".

11. The device according to claim 9, further comprising a first additional element for detecting errors in the configuration of the bits of said second sequence by detecting a predetermined logical configuration.

12. The device according to claim 9, further comprising a second additional element for detecting an erroneous configuration of said slice after decoding, when the logical configuration of the bits of said second sequence indicates that said bit has been inverted during said encoding, said erroneous configuration appearing when the 3 bits of said slice are in the same logical state.

* * * * *